(12) United States Patent
Lin et al.

(10) Patent No.: US 8,614,927 B2
(45) Date of Patent: Dec. 24, 2013

(54) CURRENT LEAKAGE REDUCTION

(75) Inventors: Sung-Chieh Lin, Hsinchu (TW);
Kuoyuan (Peter) Hsu, San Jose, CA
(US); Jiann-Tseng Huang, Hsinchu
(TW); Wei-Li Liao, Taichung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/595,551

(22) Filed: Aug. 27, 2012

(65) Prior Publication Data
US 2012/0320700 A1 Dec. 20, 2012

Related U.S. Application Data

(63) Continuation of application No. 12/784,025, filed on May 20, 2010, now Pat. No. 8,270,240.

(60) Provisional application No. 61/229,985, filed on Jul. 30, 2009.

(51) Int. Cl.
*G11C 7/00* (2006.01)

(52) U.S. Cl.
USPC ... 365/201; 365/96; 365/189.011; 365/225.7; 365/230.03; 365/230.08

(58) Field of Classification Search
USPC ............ 365/96, 189.011, 225.7, 239, 230.03, 365/230.08, 189.05, 201
See application file for complete search history.

(56) References Cited

U.S. PATENT DOCUMENTS

| 6,163,497 | A | 12/2000 | Jung |
| 6,208,567 | B1 | 3/2001 | Yamauchi et al. |
| 6,246,627 | B1 * | 6/2001 | Yamauchi et al. ............. 365/229 |
| 6,909,639 | B2 * | 6/2005 | Park et al. ................ 365/185.25 |
| 6,947,341 | B2 | 9/2005 | Stubbs et al. |
| 7,272,035 | B1 * | 9/2007 | Chen et al. .................... 365/158 |
| 7,307,899 | B2 | 12/2007 | Khellah et al. |
| 7,551,497 | B2 | 6/2009 | Yuan |
| 7,688,613 | B2 | 3/2010 | Chung et al. |
| 2010/0165766 | A1 | 7/2010 | Jeong |

* cited by examiner

*Primary Examiner* — Thao Bui
(74) *Attorney, Agent, or Firm* — Lowe Hauptman & Ham, LLP

(57) ABSTRACT

This description relates to a circuit including a bit line. The circuit further includes at least one memory bank. The at least one memory bank includes at least one memory cell, a first device configured to provide a current path between the bit line and the at least one memory cell when the at least one memory cell is activated, and a second device configured to reduce current leakage between the bit line and the at least one memory cell when the at least one memory cell is deactivated. The circuit further includes a tracking device configured to receive a mirror current substantially equal to a current along the current path, the tracking device configured to have a resistance substantially equal to a cumulative resistance of all memory cells of the at least one memory cell.

19 Claims, 2 Drawing Sheets

CURRENT LEAKAGE REDUCTION

CROSS-REFERENCE TO RELATED APPLICATIONS

The present application is a continuation application of U.S. application Ser. No. 12/784,025, filed May 20, 2010, which claims priority of U.S. Provisional Patent Application Ser. No. 61/229,985 filed on Jul. 30, 2009, both of which are incorporated herein by reference in their entirety.

FIELD

The present disclosure is generally related to current leakage. In various embodiments, a footer and a bias device in conjunction with leakage tracking is used to reduce and/or eliminate bit line current leakage.

BACKGROUND

Generally, bit lines in a memory array experience current leakage. Depending on applications, a bit line may be coupled to many bit cells (e.g., 64, 128, 256, etc., cells). When a cell is activated (e.g., turned on for reading) current may leak in other cells even though transistors in those cells have been deactivated (e.g., turned off). If, for example, a bit line is coupled to 64 memory cells, and only one cell is accessed for reading, current can leak through 63 transistors in the other 63 memory cells. The more the memory cells are coupled to a bit line, the higher the amount of current is leaked.

An approach uses leakage tracking in a bias circuit to compensate for the bit-line cell leakage. In this approach, however, the tracking cell in the worst case can be overcompensated and may cause a reading low failure when current in the tracking cell is heavily leaked. Further, leakage compensation does not work well when the current leaks heavily.

High current leakage seems to get worse due to the continued lower program voltage (e.g., 1.8V versus 2.5V) in OTP (one time programming) memory, metal fuses that replace poly fuses, expanded memory macro density, eFuse (electrical fuse) being used in high leakage processes such as G and HP, reduction of channel length to reduce the memory cell die area, etc.

BRIEF DESCRIPTION OF THE DRAWINGS

The details of one or more embodiments are set forth in the accompanying drawings and the description below. Other features and advantages of the disclosure will be apparent from the description, drawings, and claims.

Like reference symbols in the various drawings indicate like elements.

DETAILED DESCRIPTION

Figure 1:
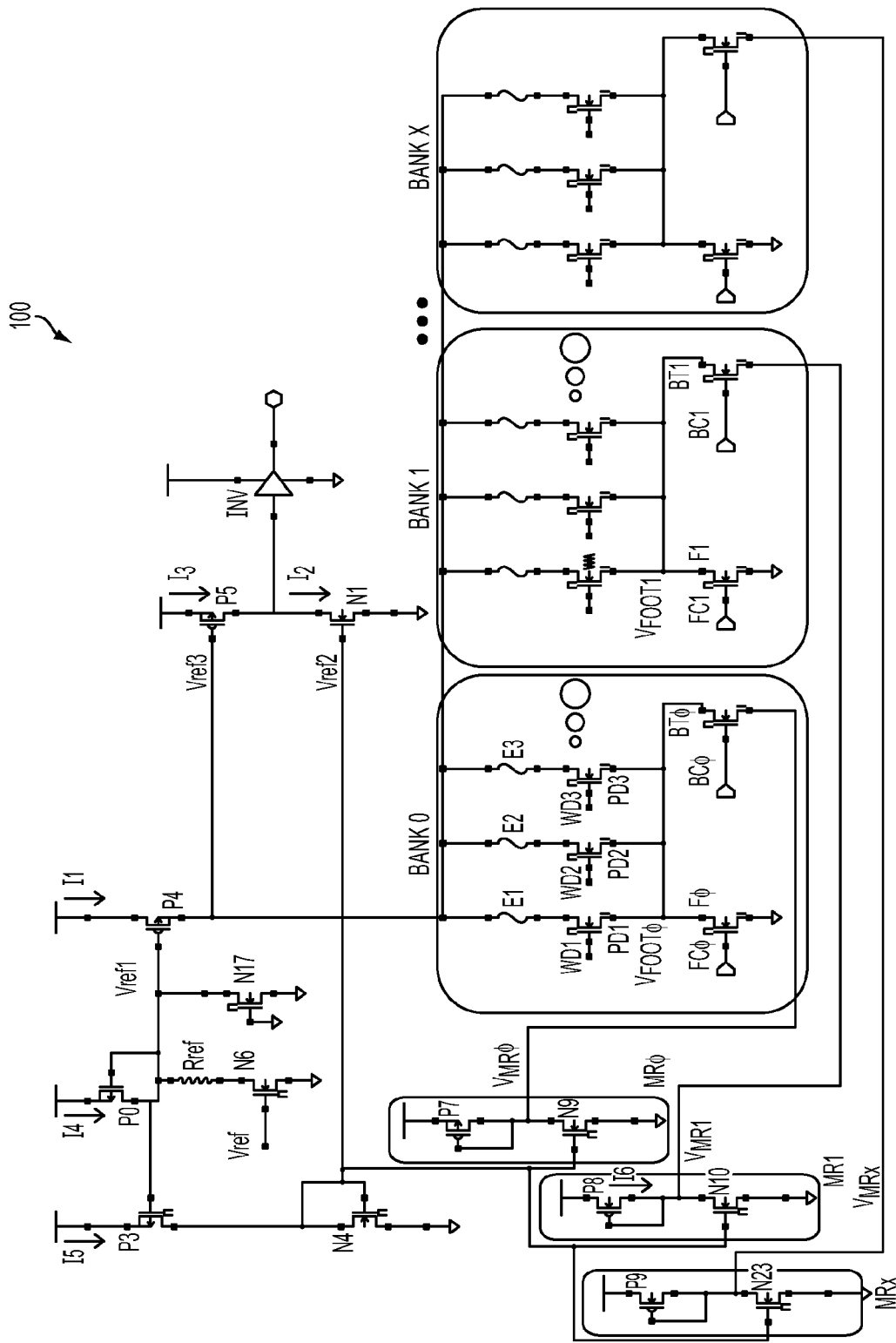
FIG. 1 shows an exemplary circuit upon which embodiments of the disclosure may be implemented.

Embodiments of the disclosure are related to current leakage. In an embodiment related to an OTP memory array, the memory array includes a bit line coupled to a plurality of memory banks. Each memory bank includes a plurality of memory cells, a footer, and a bias device, and is associated with a current mirror. When a memory cell is activated (e.g., for reading) the memory bank including the activated memory cell is referred to as an activated memory bank and other banks are referred to as deactivated memory banks. In various embodiments, a current tracking device serves to compensate for bit line leakage current in deactivated memory cells in the activated memory bank. Further, footers and bias devices in deactivated memory banks and associated current mirrors are configured to reduce/eliminate bit line current leakage through deactivated memory cells in deactivated memory banks.

Embodiments of the disclosure can have one or a combination of the following features and/or advantages. Various embodiments reduce or eliminate current leakage associated with the bit line. As a result, various embodiments are suitable for high-leakage environment such as high-leakage processes G and HP. Various embodiments are also suitable for lower eFuse program voltage (e.g., 1.8V versus 2.5V), metal fuse, high memory macro density, etc.

Embodiments, or examples illustrated in the drawings are now described using specific language. It will nevertheless be understood that no limitation of the scope of the invention is thereby intended. Any alterations and modifications in the described embodiments, and any further applications of principles described in this document are contemplated as would normally occur to one skilled in the art to which the disclosure relates. Reference numbers may be repeated throughout the embodiments, but this does not necessarily require that feature(s) of one embodiment apply to another embodiment, even if they share the same reference number.

FIG. 1 shows an exemplary circuit 100 upon which embodiments of the disclosure may be implemented. In an embodiment circuit 100 is part of an OTP memory array.

The Memory Banks

Circuit 100 includes a plurality of memory banks, e.g., banks B0 to BX. Each memory bank B includes a plurality memory (or bit) cells C (not labeled) and is associated with a current mirror MR.

Each memory cell C includes an eFuse (e.g., electrical fuse) E and a program device PD. For illustration purposes and not to obscure the drawing, only device elements including those of memory cells C in bank B0 are labeled.

The logic state of the resistance R (not labeled) of an eFuse E corresponds to the logic state of the corresponding memory cell C. To read a memory cell C the corresponding program device PD is on and the resistance level of the corresponding eFuse E is detected. If the resistance R is high then the memory cell C stores a high, and if the resistance R is low then the memory cell C stores a low. In an embodiment, resistance R is about 200 Ohm for a low and about 2K Ohm for a high.

Signals (e.g., word lines) WL control (e.g., turning on or off) program devices PD. When a signal WL is activated (e.g., high) it activates (e.g., turns on) a corresponding program device PD and thus a particular memory cell C.

Signals FC control (e.g., turning on or off) footers F. When a signal FC in a memory bank B is activated (e.g., high), it turns on the footer F in that memory bank B, which allows current to flow from bit line BL through the corresponding eFuse E, program device PD, and footer F. When the signal FC is deactivated (e.g., low), it turns off (e.g., deactivates) footer F, allowing it to behave as an open circuit, and as a result enabling current to flow between eFuse E, program device PD and bias device BT as appropriate. Those skilled in the art will recognize that a footer is named as such because it is connected to ground.

Signals BC control (e.g., turning on or off) bias devices BT. When a signal BC in a memory bank B is activated (e.g., high), it turns on the corresponding bias device BT, allowing current to flow between eFuse E, program device PD, and bias device BT. Alternatively expressed, bias devices BT, when activated, inject current to provide voltage Vfoot. When a signal BC is deactivated (e.g., low), it turns off the corresponding bias device BT, allowing it to behave as an open circuit, and as a result enabling current to flow between eFuse E, program device PD and footer F as appropriate.

Current mirrors MR provide voltages Vmr so that when bias devices BT are activated voltages Vmr (e.g., voltages Vmr1 to Vmrx) will be transferred to voltages Vfoot (e.g., Vfoot1 to Vfootx), causing voltages Vfoot to be substantially the same as voltage Vref3. In effect, voltage Vdpd at the drain of program devices PD will be substantially the same as voltages Vfoot. As a result, bit line current leakage in deactivated memory banks BD (e.g., memory banks B1 to Bx) will be reduced or eliminated, depending on applications and/or environment.

In various embodiments of the disclosure when a memory cell C is activated (e.g., for reading) other memory cells C in the same memory bank B are deactivated; the corresponding footer F is activated, and the corresponding bias device BT is deactivated. As a result, current flows between bit line BL, the activated eFuse E, the activated program device PD, and footer F. For illustration purposes, the memory bank B that includes the activated memory cell C is referred to as an activated memory bank BA while a memory bank B that does not include the activated memory cell C is referred to as a deactivated memory bank BD.

Depending on applications, while a memory cell C in an activated memory bank BA is activated memory cells C in the same memory bank BA and in other banks BD are deactivated. Various embodiments of the disclosure provide mechanisms to reduce/eliminate current leakage through deactivated memory cells C. In various embodiments, tracking is used to compensate for current leakage through deactivated memory cells C in the activated memory bank BA while footers F and bias devices BT in the deactivated memory banks BD are configured to reduce/eliminate current leakage through memory cells C in deactivated memory banks BD. In various embodiments, footers F in memory banks BD are deactivated and bias devices BT in memory banks BD are activated.

The Bit Line Current & Leakage

When transistor P4 is on current I1 flows (and leaks) from transistor P4 to various memory cells C (e.g., through various program devices PD). Various embodiments of the disclosure allow current I1 to flow through an activated memory cell C (e.g., eFuse E1, program device PD1) and the corresponding footer F0, but reduces/eliminates current leakage to other memory cells C that are not activated, including deactivated memory cells C in both the activated memory bank BA and in deactivated memory banks BD.

For illustration purposes, bank B0 is activated while banks B1 through BX are deactivated. Further, a memory bank B (e.g., bank B0) includes eight memory cells C(0,0) to C(0,7) (not labeled), and one memory cell C (e.g., cell C(0,0)) is activated while other memory cells C (e.g., cells C(0,1) to C(0,7)) are deactivated. The explanation below is based on bank B1, but the operation of banks B2 to BX are similar to that of bank B1.

Compensation for Current Leakage in Activated Memrory Bank

In various embodiments, when bank B0 is activated, current I1 flows from bit line BL into memory cell C(0,0), and leaks through other deactivated memory cells in bank B0 (e.g., cells C(0,1) to C(0,7)). Tracking device (e.g., transistor) N17 is used to track and thus compensate for the current leakage, if any, from bit line BL through deactivated memory cells C(0,1) to C(0,7). If there is any leakage current associated with bit line BL and memory cells C(0,1) to C(0,7), current I1 would be affected (e.g., increased in the embodiment of FIG. 100). Because current I4 and I1 are mirrored as explained below, transistor N17 provides a current path for the change (e.g., increase) in current I1 to be reflected on current I4. That is, for example, if current I1 increases due to the leak into memory cells C(0,1) to C(0,7), current I4, through the drain to source of transistor N17, increases by a substantially the same amount, resulting in compensation. The current drawn by transistor N17 affecting the compensation current varies depending on its size and various other factors, including, for example, the number of memory cells C in a memory bank B, the size of transistors P4 and P0, etc. In an embodiment, the size of transistor N17 is substantially equal to the total size of program devices PD in a memory bank B, and the resistance of transistor N17 is substantially equal to the total resistance of program devices PD in a memory bank B. In various embodiments, transistor N17 corresponds to one or a plurality of memory cells C in a memory bank B without eFuses E because the resistance R of an eFuse E is insignificant as compared to that of transistor N17 or program device PD. For example, if transistor N17 corresponds to one memory cell C, then the resistance of transistor N17 is substantially the same as the resistance of the corresponding program device PD. Because the resistances are substantially the same, the leakage and the compensation currents are substantially the same.

Reduce/Eliminate Current Leakage in Deactivated Memory Banks

In various embodiments of the disclosure when Vref1=Vref3 (and I2=I3), voltage Vref3 is substantially the same (e.g., the same) as voltage Vfoot, which is the voltage level at the drain of a footer F and a bias device BT and the sources of program devices PD in a memory bank B. Further because the current leakage from bit line BL through a memory cell C (e.g., eFuse E and program device PD) is insignificant when this memory cell C is deactivated, the voltage drop across an eFuse E is also insignificant. As a result, the voltage level Vdpd (not labeled) at the drain of a program device PD is the same as voltage Vref3. Because voltage Vdpd is the same as voltage Vref3 or Vfoot, there is no or insignificant current leakage through deactivated memory cells C. Alternatively expressed, embodiments of the disclosure reduce or eliminate current leakage.

Voltage Vref generates voltage Vref1 and Vref2. When voltage Vref activates transistor N6, it generates current I4 flowing through transistor P0, resistor Rref and transistor N6, which also generates voltage Vref1 at the source and the gate of transistor P0. Those skilled in the art will recognize that because transistor N6 is an NMOS, current I4 is proportional to voltage Vref.

Current I4 is mirrored to current I5 via PMOS transistor P3 and NMOS transistor N4. Because transistors P3 and N4 serve as a current mirror of current I4 to current I5, once current I4 is generated current I5 is generated (e.g., mirrored), and voltage Vref2 is also generated. Current I4 is also mirrored to current I1 via PMOS transistor P4.

Transistors P5, N1 and inverter INV form the sensing circuit (e.g., sense amplifier) for circuit 100. Voltage Vref1 at the gate of PMOS transistor P4 controls this transistor P4 while voltage Vref2 at the gate of NMOS transistor N1 controls this transistor N1. As a result, voltage Vref1 generates current I1 while voltage Vref2 generates current I2. As discussed above, current I1 is a current mirrored from current I4 through transistor P4, and current I2 is a current mirrored from current I5. Because I5=I4, I2=I4. Voltage Vref3 at the source of transistor P4 and the gate of PMOS transistor P5 controls this PMOS transistor P5, and thus generates current I3. In various embodiments of the disclosure when Vref3=Vref1, I2=I3, and Vref3=Vfoot when the corresponding bias device BT is on.

Voltage Vref3 at the source of PMOS transistor P4 and the gate of PMOS transistor P5 controls PMOS transistor P5 and thus generates current I3. Because transistor P5 is a PMOS, voltage Vref3 is inversely proportionate to current I3. That is, if Vref3 increases, current I3 decreases, and if Vref3 decreases, I3 increases. Because R=Vref3/I1 or Vref3/I4 and Rref=Vref1/I4, then if R=Rref then Vref3=Vref1. As a result, if R<Rref then Vref3<Vref1, and if R>Rref then Vref3>Vref1. Alternatively expressing, if Vref3=Vref1 then R=Rref. If Vref3<Vref1 then R<Rref, and if Vref3>Vref1 then R>Rref.

Because transistor P5 can act as a current mirror for current I4 when Vref1, the voltage level at the gate of transistor P0, equals to Vref3, the voltage level at the gate of transistor P5, if Vref3=Vref1, then I3=I4 or I3=I2 because I2 is a mirrored current of I5, which is a mirrored current of I4. If Vref3 increases such that Vref3>Vref1 (or R>Rref) then I3 decreases or I3<I2 because I2 remains unchanged as Vref2 remains unchanged. Similarly, if Vref3 decreases such that Vref3<Vref1 (or R<Rref) then I3>I2. Because when Vref3=Vref1, R=Rref, when Vref3>Vref1 R>Rref, and when Vref3<Vref1 R<Rref. Alternatively expressed, if R=Rref then I3=I2. If R>Rref then I3>I2, and if R<Rref then I3<I2.

Because the gate of transistor N4 is coupled to the gate of transistor N10, the gate of these transistors experiences the same voltage Vref2. As a result, current I5 is mirrored to current I6 through PMOS transistor P8 and NMOS transistor N10, and Vmr1=Vref1. When bias device BT1 is on voltage Vfoot1 is substantially the same (e.g., the same) as voltage Vmr1 (e.g., Vfoot1=Vmr1). Further, when I2=I3, Vref1=Vref3. As a result when I2=I3, Vref3=Vmr1. When bias device BT1 is on, voltage Vmr1 is substantially the same (e.g., the same) as voltage Vfoot1. As a result, voltage Vref3 is substantially the same as voltage Vfoot1. As discussed above when memory cells C in deactivated memory bank BD are deactivated the voltage dropped across eFuse E in deactivated memory cells C are insignificant. As a result, the voltage at the drain of deactivated memory cells C are substantially the same as voltage Vfoot1, resulting in zero or insignificant current leakage.

Method Embodiment

Figure 2:
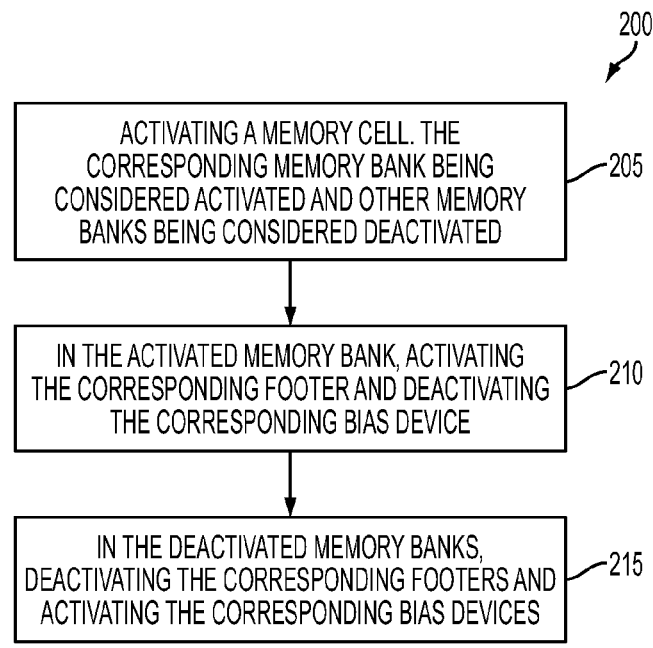
FIG. 2 shows a flowchart illustrating a method embodiment to reduce/eliminate current leakage in the circuit of FIG. 1.

FIG. 2 shows a flowchart illustrating a method embodiment that reduces/eliminates current leakage through both activated and deactivated memory banks in a circuit (e.g., circuit 100).

In block 205, a memory cell (e.g., cell C(0,0)) is activated, e.g., for reading. As a result, memory bank B0 is considered activated while other banks, e.g., banks B1 to Bx, are considered deactivated.

In block 210, the footer F corresponding to the activated memory cell (e.g., footer F0) is activated and the bias device BT corresponding to the activated memory cell (e.g., bias device BT0) is deactivated.

In block 215, in memory banks B1 to Bx that are deactivated the corresponding footers (e.g., footers F1 to Fx) are deactivated and bias devices BT (e.g., devices BT1 to BTx) are activated.

Based on the above configuration, current leakage may be reduced and/or eliminated. For example, in activated memory bank B0, tracking device N17 tracks the current leakage through deactivated memory cells C in memory bank B0 (e.g., memory cells C(0,1) to C(0,7)) and provide appropriate compensation. In deactivated memory banks B1 to Bx, because bias devices BT1 and BTx are activated, current mirrors MR1 to MRX are configured such that voltage Vref3 is substantially equal to voltage Vfoot1 to Vfootx, which reduces/eliminates current leakages through memory cells C in deactivated memory banks B1 to Bx.

A number of embodiments of the disclosure have been described. It will nevertheless be understood that various modifications may be made without departing from the spirit and scope of the invention. For example, in the illustrative circuits, when a resistor is used, a resistive circuit, component, or device may be used to replace that resistor. Some transistors are shown to be N-type and some others are shown to be P-type, but the disclosure is not limited to such a configuration because selecting a transistor type (e.g., N-type, P-type) is a matter of design choice based on need, convenience, etc. Embodiments of the disclosure are applicable in variations and/or combinations of transistor types. Additionally, some signals are illustrated with a particular logic level to operate some transistors (e.g., activated high, deactivated low, etc.), but selecting such levels and transistors are also a matter of design choice, and embodiments of the disclosure are applicable in various design choices.

The above method embodiment shows exemplary steps, but these steps are not necessarily required to be performed in the order shown. Steps may be added, replaced, changed order, and/or eliminated as appropriate, in accordance with the spirit and scope of the invention.

One aspect of this description relates to a circuit including a bit line. The circuit further includes at least one memory bank. The at least one memory bank includes at least one memory cell, a first device configured to provide a current path between the bit line and the at least one memory cell when the at least one memory cell is activated, and a second device configured to reduce current leakage between the bit line and the at least one memory cell when the at least one memory cell is deactivated. The circuit further includes a tracking device configured to receive a minor current substantially equal to a current along the current path, the tracking device configured to have a resistance based on a cumulative resistance of memory cells of the at least one memory cell.

Another aspect of this description relates to a circuit including a bit line and a first memory bank. The first memory bank including at least one first memory cell, a first device configured to provide a current path between the bit line and the at least one first memory cell when the at least one first memory cell is activated, and a second device configured to reduce current leakage between the bit line and the at least one first memory cell when the at least one first memory cell is deactivated. The circuit further includes a second memory bank. The second memory bank includes at least one second memory cell, wherein a number of the at least one second memory cell is equal to a number of the at least one first memory cell, a third device configured to provide a current path between the bit line and the at least one second memory cell when the at least one second memory cell is activated, and a fourth device configured to reduce current leakage between the bit line and the at least one second memory cell when the at least one second memory cell is deactivated. The circuit further includes a tracking device configured to receive a mirror current substantially equal to a current along the current path, the tracking device configured to have a resistance based on a cumulative resistance of memory cells of the at least one memory cell.

Still another aspect of this description relates to a method including coupling a bit line to at least one memory bank. The at least one memory bank including at least one memory cell, a first device, and a second device. The method further includes deactivating a first memory cell of the at least one memory cell and deactivating the first device associated with the first memory cell. The method further includes activating the second device associated with the first memory cell and tracking a current along the current path, using a tracking device having a resistance based on a cumulative resistance of memory cells of the at least one memory cell.

Each claim of this document constitutes a separate embodiment, and embodiments that combine different claims and/or different embodiments are within the scope of the disclosure and will be apparent to those of ordinary skill in the art after reviewing this disclosure.

What is claimed is:

1. A circuit comprising:
   a bit line;
   at least one memory bank, the at least one memory bank comprising:
      at least one memory cell,
      a first device configured to provide a current path between a reference node and the at least one memory cell when the at least one memory cell is activated, and
      a second device configured to reduce current leakage between the bit line and the reference node through the at least one memory cell when the at least one memory cell is deactivated; and
   a tracking device configured to adjust a current along the current path, the tracking device configured to have a resistance based on a resistance of memory cells of the at least one memory cell.

2. The circuit of claim 1, further comprising a current mirror configured to provide a first voltage at a first end of the at least one memory cell if the at least one memory cell is deactivated.

3. The circuit of claim 2, wherein a second voltage at a second end of the at least one memory cell is equal to the first voltage.

4. The circuit of claim 2, further comprising a sensing circuit electrically connected to the bit line.

5. The circuit of claim 1, wherein the at least one memory bank is configured to turn on the first device and turn off the second device when the at least one memory cell is activated.

6. The circuit of claim 1, wherein a size of the tracking device is substantially equal to a cumulative size of all memory cells of the at least one memory cell.

7. The circuit of claim 1, wherein the at least one memory cell comprises an e-fuse.

8. A method of operating a circuit, the circuit comprising a first memory cell, a second memory cell, and a bit line coupled to first ends of the first and second memory cells, the method comprising:
   decoupling, by a first device, a second end of the first memory cell from a first node;
   coupling a second end of the second memory cell to the first node;
   adjusting a current flowing through the second memory cell by a tracking device, the tracking device having a resistance based on a resistance of the first memory cell or the second memory cell;
   adjusting a first voltage at a second node by the tracking device; and
   coupling, by a second device, the second end of the first memory cell with the second node.

9. The method of claim 8, further comprising providing the first voltage to the second node using a current mirror.

10. The method of claim 9, further comprising providing an input voltage to a sensing circuit, wherein the input voltage is equal to the first voltage.

11. The method of claim 8, further comprising generating a second voltage at the first end of the first memory cell, wherein the second voltage is substantially equal to the first voltage.

12. The method of claim 8, wherein the adjusting the first voltage at the second node by the tracking device comprises:
   generating a first current responsive to a reference voltage;
   generating a second current by the tracking device;
   generating, by a current mirror, a third current responsive to the first current and the second current; and
   generating the first voltage responsive to the third current.

13. The method of claim 8, further comprising generating a second voltage at the first end of the first memory cell, comprising:
   generating a first current responsive to a reference voltage;
   generating a second current by the tracking device;
   generating, by a current mirror, a third current responsive to the first current and the second current; and
   generating the second voltage by causing the third current to flow through at least one memory cell coupled to the bit line, the at least one memory cell comprising the first memory cell or the second memory cell.

14. A circuit comprising:
   a first transistor of a first type, a first terminal of the first transistor being coupled with a first power node, a gate terminal of the first transistor being coupled with a second terminal of the first transistor, and the second terminal of the first transistor being configured to receive a first reference current;
   a second transistor of the first type, a first terminal of the second transistor being coupled with the first power node, a gate terminal of the second transistor being coupled with the gate terminal of the first transistor, and a second terminal of the second transistor being configured to output a second reference current;
   a third transistor of the first type, a gate terminal of the third transistor being coupled with a second terminal of the third transistor, and the third transistor being configured to generate a first reference voltage at the second terminal of the third transistor responsive to the first reference current;
   a memory cell having a first end and a second end, the first end of the memory cell being coupled with the second terminal of the second transistor;
   a fourth transistor having a first terminal coupled with the second terminal of the third transistor, a second terminal coupled with the second end of the memory cell, and a gate terminal configured to receive a first control signal; and
   a fifth transistor having a first terminal coupled with a second power node, a second terminal coupled with the second end of the memory cell, and a gate terminal configured to receive a second control signal.

15. The circuit of claim 14, further comprising:

a sixth transistor of the first type, a first terminal of the sixth transistor being coupled with the first power node, a gate terminal of the sixth transistor being coupled with the gate terminal of the first transistor;

a seventh transistor of a second type, a first terminal of the seventh transistor being coupled with the second power node, a gate terminal and a second terminal of the seventh transistor being coupled with a second terminal of the sixth transistor; and an eighth transistor of the second type, a first terminal of the eighth transistor being coupled with the second power node, a gate terminal of the eighth transistor being electrically coupled with the gate terminal of the seventh transistor, and a second terminal of the eighth transistor being coupled with the second terminal of the third transistor.

16. The circuit of claim 14, wherein the memory cell comprises an e-Fuse.

17. The circuit of claim 14, further comprising:

a resistive device having a first end and a second end, the first end of the resistive device coupled with the second terminal of the first transistor; and a sixth transistor of a second type, a first terminal of the sixth transistor being coupled with the second power node, a second terminal of the sixth transistor being coupled with the second end of the resistive device, and a gate terminal of the sixth transistor being configured to receive a second reference voltage.

18. The circuit of claim 14, further comprising:

a sixth transistor of a second type, a first terminal of the sixth transistor being coupled with the second power node, a second terminal of the sixth transistor being coupled with the second terminal of the first transistor, and a gate terminal of the sixth transistor being coupled with the second power node.

19. The circuit of claim 18, further comprising one or more other memory cells coupled with the second terminal of the second transistor, wherein a size of the sixth transistor is set according to a cumulative size of the memory cell and the one or more other memory cells.

* * * * *